(12) United States Patent
Colvin et al.

(10) Patent No.: US 8,779,395 B2
(45) Date of Patent: *Jul. 15, 2014

(54) AUTOMATIC CONTROL SYSTEM FOR SELECTION AND OPTIMIZATION OF CO-GAS FLOW LEVELS

(75) Inventors: Neil K. Colvin, Merrimack, NH (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 116 days.

This patent is subject to a terminal disclaimer.

(21) Appl. No.: 13/308,795

(22) Filed: Dec. 1, 2011

(65) Prior Publication Data

US 2013/0140473 A1 Jun. 6, 2013

(51) Int. Cl.
*H01J 37/317* (2006.01)
(52) U.S. Cl.
USPC ............... 250/492.21; 250/492.3; 250/423 R; 250/424; 250/431; 118/723 R; 438/961; 438/513

(58) Field of Classification Search
USPC ............ 250/492, 21, 492.3, 423 R, 424, 431; 118/723 R; 438/961, 513
See application file for complete search history.

(56) References Cited

U.S. PATENT DOCUMENTS

| | | | |
|---|---|---|---|
| 8,524,584 B2 * | 9/2013 | Lee et al. | 438/513 |
| 2012/0118232 A1 * | 5/2012 | Colvin et al. | 118/723 R |
| 2012/0119113 A1 * | 5/2012 | Colvin et al. | 250/492.3 |
| 2012/0190181 A1 * | 7/2012 | Lee et al. | 438/513 |

* cited by examiner

*Primary Examiner* — Nikita Wells
(74) *Attorney, Agent, or Firm* — Eschweiler & Associates, LLC (57) ABSTRACT

An ion implantation system for improving performance and extending lifetime of an ion source is disclosed whereby the selection, delivery, optimization and control of the flow rate of a co-gas into an ion source chamber is automatically controlled.

20 Claims, 11 Drawing Sheets

AUTOMATIC CONTROL SYSTEM FOR SELECTION AND OPTIMIZATION OF CO-GAS FLOW LEVELS

FIELD

The invention relates generally to semiconductor device fabrication and ion implantation, and more particularly to a control system for the control and optimization of co-gas flow levels.

BACKGROUND

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

Figure 1:
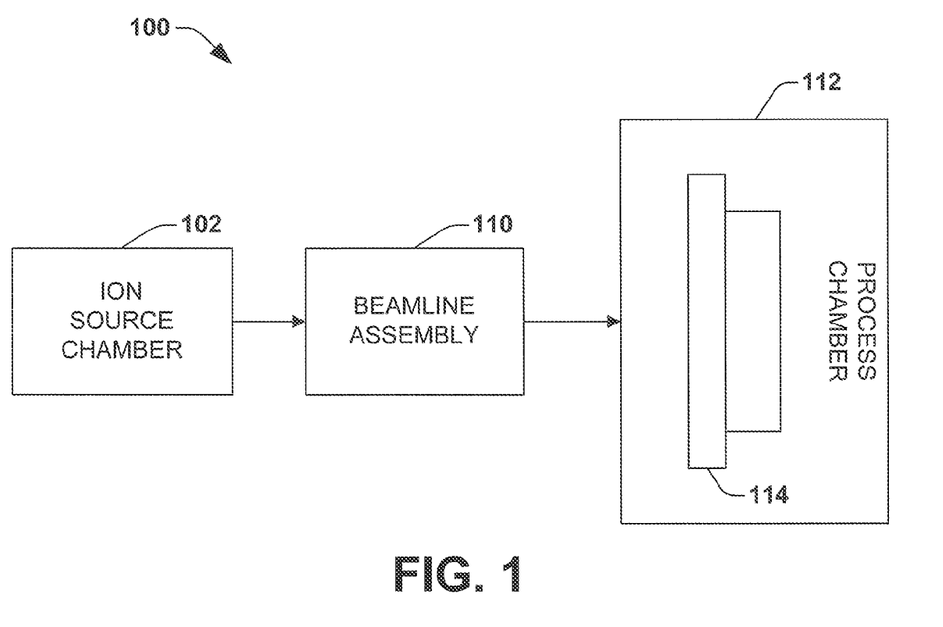
FIG. 1 is an ion implantation system suitable for implementing one or more aspects of the invention in block diagram form.

Referring to FIG. 1 ion implanters or ion implantation systems typically include three sections or subsystems: (i) an ion source chamber 102 containing an ion source for outputting an ion beam, (ii) a beamline assembly 110 including a mass analysis magnet for mass resolving the ion beam, and (iii) a process chamber 112 which contains a target location that receives the ion beam from the beam line assembly, such as a semiconductor wafer 114 or other substrate to be implanted by the ion beam. The continuing trend toward smaller semiconductor devices requires a beamline construction which serves to deliver contamination free and higher beam currents at all energies. The high beam current provides the necessary dosage levels, while the low energy permits shallow implants. Source/drain junctions in semiconductor devices, for example, require such a high current, low energy application.

Ion sources in ion implanters typically generate an ion beam by ionizing within the source chamber 102 a source gas, a component of which is a desired dopant element, and extracting the ionized source gas in the form of an ion beam. The ion source may take the form of an indirectedly heated cathode (IHC), typically utilized in low energy/high current, medium current and high energy ion implantation equipment.

When the ion source is operated using a molecular gas form of the desired material to be ionized and implanted into the substrate undesirable by-products of this gas ionization are produced. Properties of these gas species generated during the disassociation/ionization of the source gas are corrosive and/or highly reactive. These undesirable by-products result in damage to the internal and external mechanical and electrical components that are critical to the ion source performance. Some of these species, desirable or undesirable, may have very low vapor pressures, and as a result condense on the interior surfaces of the source as well as reacting with the construction materials of the cathode electrodes, repeller electrode and interior wall surfaces of the chamber. These solid deposits or chemical by products may interfere with ion source operation over time, for example by changing the electrical characteristics of the internal and external arc chamber electrical components, or partially blocking the ion source electrode aperture, thereby reducing the available ion current and detrimentally affecting the efficiency of the ion source and of the chamber 102.

Additionally, where fluorine-containing source gases are utilized, excess free fluorine radicals in the ion source chamber 102 can result in etching of the chamber housing material and internal components. The reactant(s) are highly volatile in nature at the ion source operating temperature. They either decompose or are pumped away. Fragile columnar structures build up due chemical etching and/or the halogen cycle and break off causing discharges by either bridging the cathode or repeller to ground or being ejected into the extraction to extraction suppression high voltage gap causing a discharge. This material can then be transported down the beamline to the wafer. It has been shown that material or debris that is generated inside the ion source chamber or picked up by the beam sweeping/modulating when it is interrupted by a discharge and may be transported to the substrate. These particulates have a direct effect on semiconductor device yield.

When running oxygen containing source gases, free oxygen radicals form oxides which will reduce cathode electron emission (poison) and lower required ion beam current.

In order to combat such effects, it has been known to run a co-gas with the source gases, thereby removing/minimizing undesirable species generated from the disassociation and ionization of source gases. Ion beam current, as well as lifetime of the ion source are thereby increased. Ion beam stability, particles and metal contamination are reduced. Thus, the ability to automatically control the selection and optimization of the flow rate of these co-gases would be desirable.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the invention facilitate ion implantation processes by providing a method for the selection, delivery, optimization and control of the flow rate of a co-gas into an ion source chamber, improving performance of an ion source in an ion implanter. Associated apparatus and an ion implantation system for carrying out the method are disclosed herein.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

The invention will now be described with reference to the attached drawings, wherein like reference numerals are used to refer to like elements throughout. It will be appreciated by those skilled in the art that the invention is not limited to the exemplary implementations and aspects illustrated and described hereinafter.

Figure 2A:
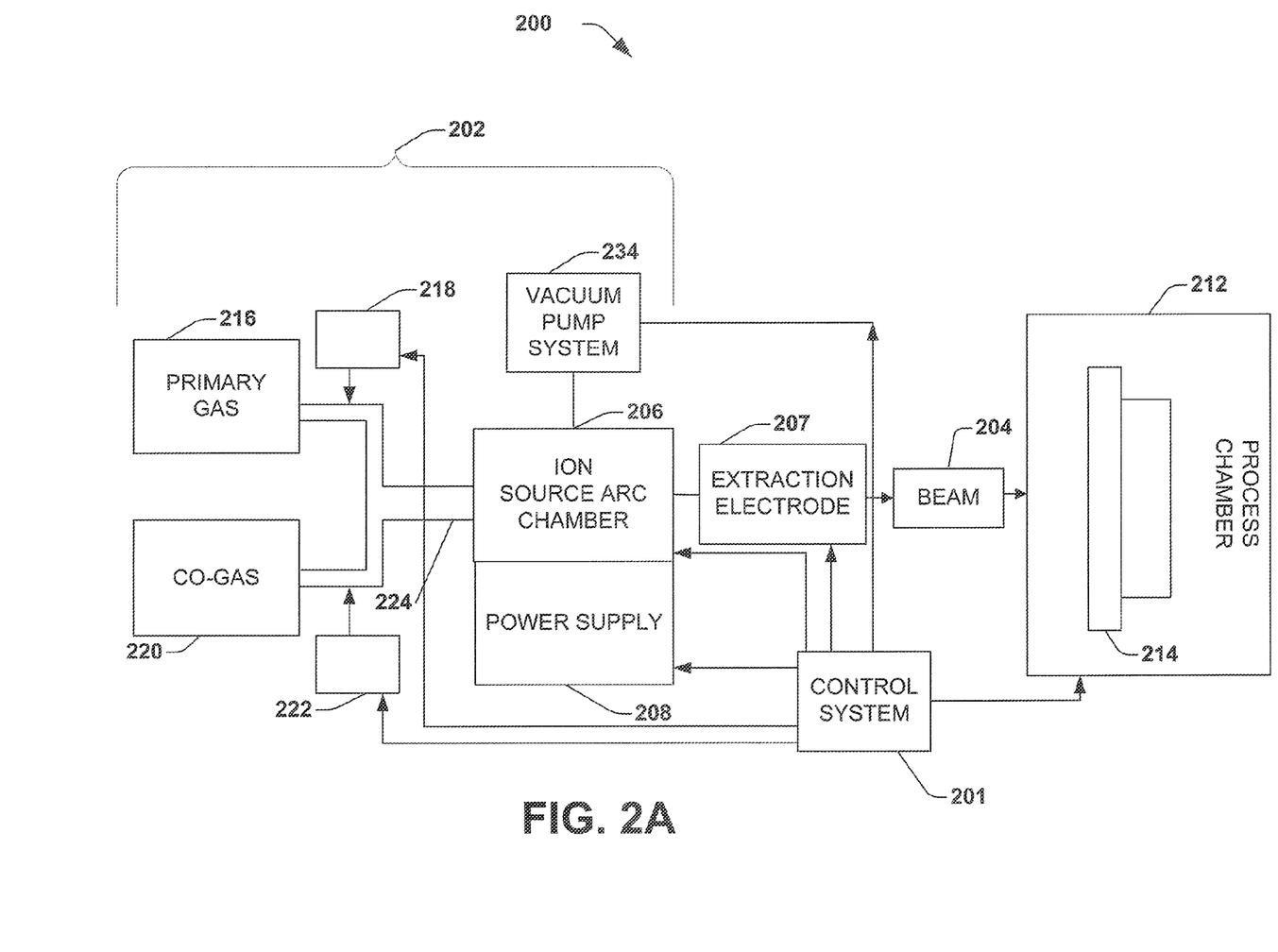
FIG. 2A is an ion implantation system illustrating one embodiment of an ion source assembly in accordance with an aspect of the invention.

Referring initially to FIG. 2A, an ion implantation system 200 suitable for implementing one or more aspects of the invention is depicted in block diagram form.

The system 200 includes an ion source assembly 202 for producing an ion beam 204 along a beam path. The ion source assembly 202 includes, for example, an arc ion source 206 with an associated power supply 208. The arc ion source 206 may, for example, comprise a relatively long plasma confinement chamber from which an ion beam is extracted and accelerated.

A supply of a first gas source, or primary gas source 216 is coupled to the ion source chamber 206 via an inlet 224. Examples of desired dopant elements of which the primary gas 216 is comprised include boron (B), germanium (Ge), carbon (C) phosphorus (P), or silicon (Si). The primary gas may be, for example, a fluorine-containing gas, such as boron trifluoride ($BF_3$), germanium tetrafluoride ($GeF_4$), phosphorous trifluoride ($PF_3$), or silicon tetrafluoride ($SiF_4$) or carbon dioxide ($CO_2$), carbon monoxide (CO), phosphine ($PH_3$), arsine ($AsH_3$), methane ($CH_4$), toluene ($C_7H_8$) amongst others. A primary gas module 218 operatively controls the flow rate of primary gas source 216 to the ion source chamber 206. A supply of at least one second gas source, or co-gas 220 is coupled to co-gas module 222 via inlet 224. Examples of suitable co-gases include hydrogen ($H_2$), AsH, phosphine ($Ph_3$), fluorine ($F_2$), $BF_3$, $SiF_4$ or inert/noble gases. Co-gas module 222 operatively controls the flow rate of co-gas to be supplied to ion source chamber 206.

A control system 201 is present that can control, communicate with and/or adjust the ion source 206, the power supply 208, vacuum pump system 234, primary 218 and co-gas 222 modules, extraction electrode 207, and process chamber 212. The control system 201 may comprise a computer, microprocessor, etc., and may be operable to take measurements and make adjustments as necessary.

Figure 2B:
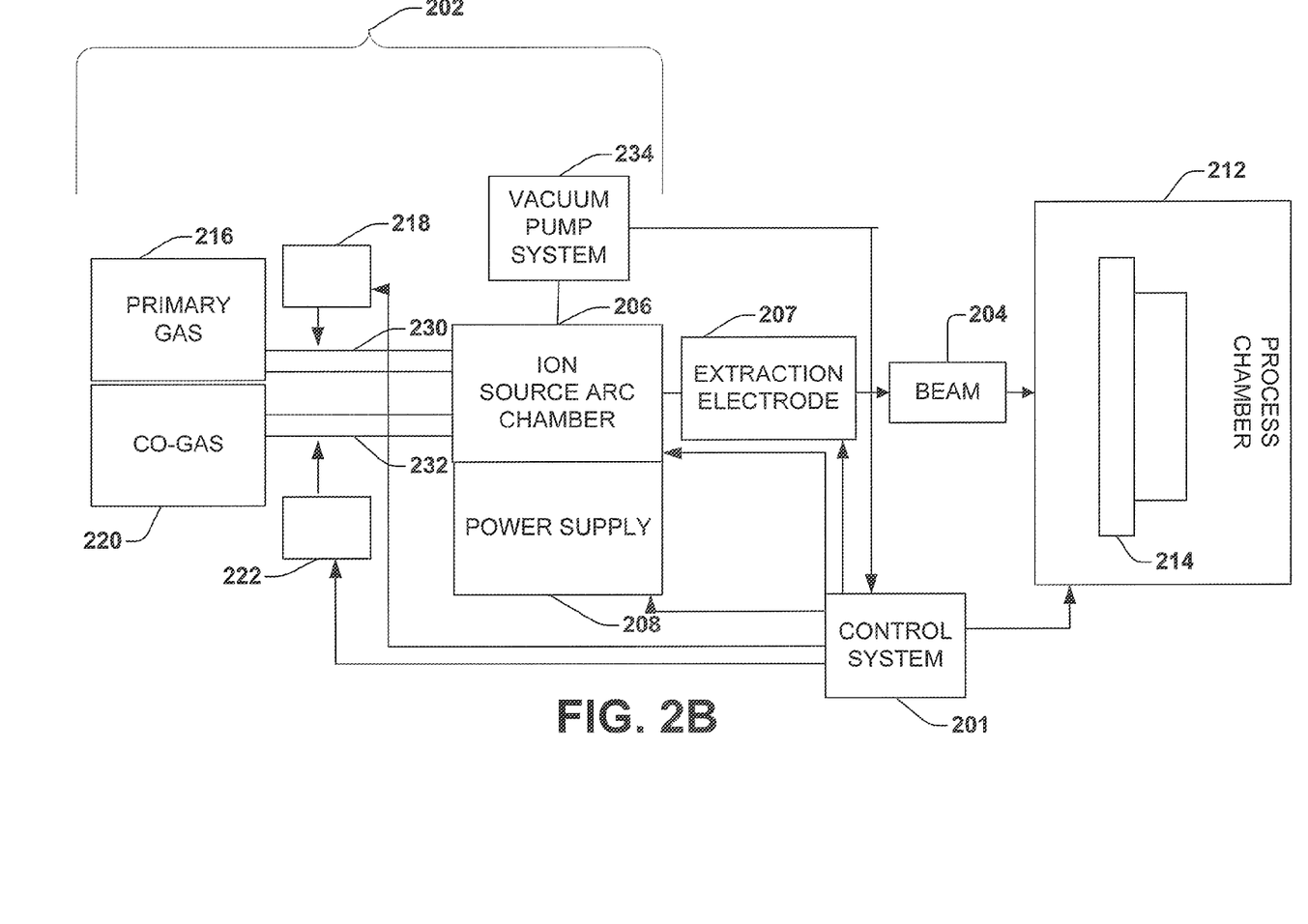
FIG. 2B is an ion implantation system illustrating an alternative embodiment of an ion source assembly in accordance with an aspect of the invention.

FIG. 2B illustrates an additional embodiment of the invention. Where the co-gas source is a fluorine-containing co-gas source, special considerations must be provided as the fluorine-containing co-gas source must be delivered to the ion source chamber separately from the primary gas source. Thus, ion source chamber 206 will comprise two separate inlets 230, 232, for primary gas 216 and co-gas 220 source respectively, such that the gas is mixed in the ion source chamber 206 only. Primary gas module 218 operatively controls the flow rate of primary gas source 216 to the ion source chamber 206, while co-gas module 222 operatively controls the flow and rate of co-gas supplied to ion source chamber 206.

Figure 3:
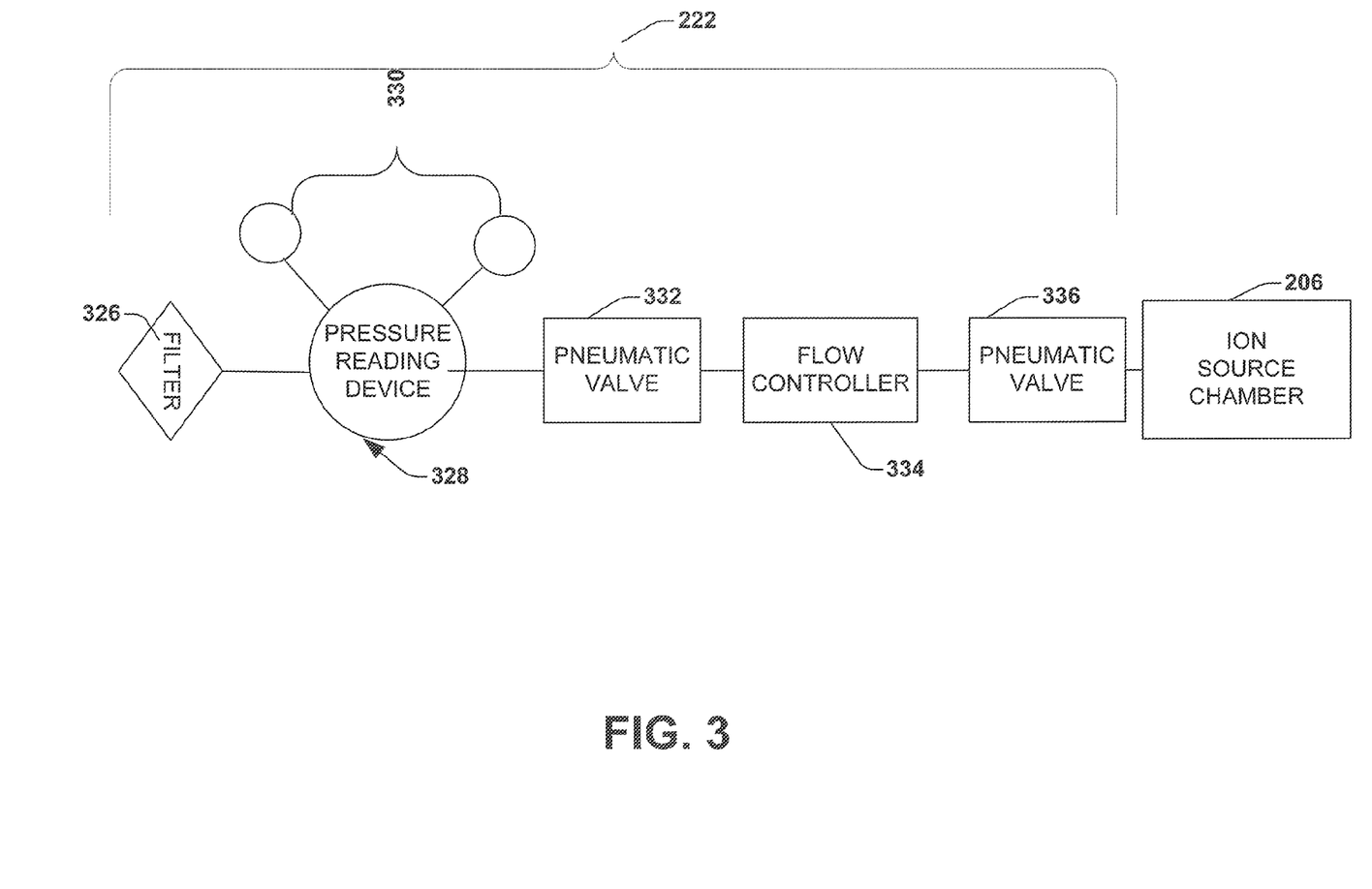
FIG. 3 is a co-gas module in accordance with an aspect of the invention.

Referring to FIG. 3, there is illustrated an embodiment of co-gas module 222. The gas module 222 comprises a filter 326 to filter out any particulates and impurities from the primary gas 216 or co-gas source 220 and is operatively connected to a pressure reading device 328. Pressure reading device 328 can include a regulators 330. Downstream of the pressure reading device 328 is a first pneumatic valve 332 having an open/close sensor. Pressure reading device 332 is connected to a flow controller 334 which controls flow rate of the co-gas 220 into the ion source chamber 206. A second pneumatic valve 336 is located following the flow controller 334. The co-gas controller 222 is defined as either a high pressure assembly or a sub-atmospheric assembly based upon data received from the pressure reading device 328.

The primary gas module 218 will be specific to a particular primary gas source 216 and the co-gas module 222 will be specific to a particular co-gas source 220. While a single co-gas module 222 and a single primary gas module 218 are illustrated, it will be understood that multiple modules 218, 222 may be installed in the ion implantation system 200. Thus, each primary and co-gas will have a separate gas module per FIG. 222 which may use a shared feed into the arc chamber as per FIG. 2A One possible exception to this would be where the co-gas source is a fluorine-containing gas, in which case a non-shared dedicated gas feed to the arc chamber 206 as illustrated in FIG. 2B is necessary.

Figure 4A:
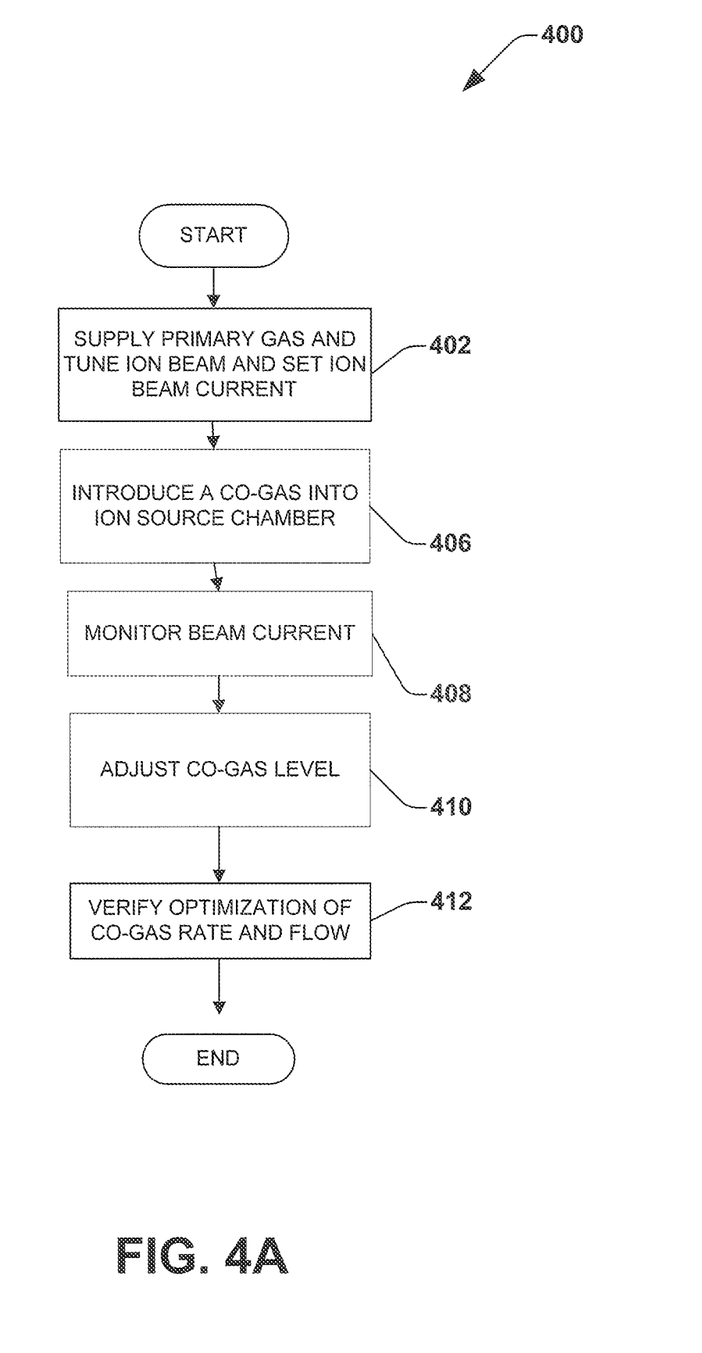
FIG. 4A is flow diagram illustrating one embodiment of a method of controlling the flow rate of a co-gas in accordance with an aspect of the invention.

During operation of the ion arc chamber 206, a user assigns a gas type from a selection table for each gas module 222 and 218 in the system 200. Based upon the primary gas source 216 saved by the user and the pressure feedback received from the pressure reading device 328, the control system 201 will automatically select the required co-gas module 222 for the primary gas source 216. The control system 201 will also select the required gas module 222 for the primary gas source based upon the desired implant species FIG. 4A is a flow diagram illustrating one embodiment of a method 400 for improving performance of an ion implantation system by automatically controlling co-gas flow rates in accordance with an aspect of the invention. The method 400 employs at least one co-gas during operation of the ion implantation system. The above figures and description can also be referenced with this method 400 for further description.

The optimization method 400 begins at block 402 wherein the primary gas 216 is supplied to the arc chamber 206 and the ion beam is tuned to the required beam current manually or by the control system 201. The method continues at 406 where at least one co-gas is introduced into an ion source arc chamber. The at least one co-gas is introduced into the ion source arc chamber at some predetermined linear increasing flow rate. The ion beam current is then monitored to the to point the required beam current is maintained with minimum unwanted species achieved (gas species dependant). At this point the dopant and co-gas ratio have been optimized. Upon detection of a drop in the ion beam current, the at least one co-gas level is adjusted 410 by reducing the co-gas flow rate by a user defined percentage. The method 400 may further include optimization of the co-gas flow rate during the life of the ion source arc chamber 206 by verifying co-gas flow rate at predetermined times.

Figure 4B:
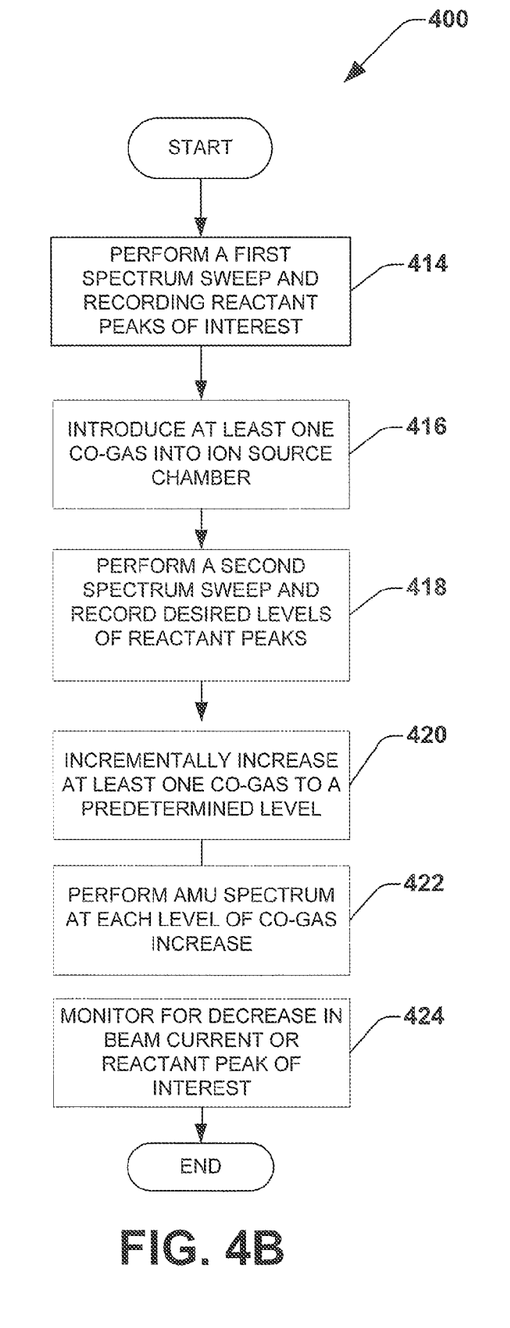
FIG. 4B is flow diagram illustrating an alternative embodiment of a method of controlling the flow rate of a co-gas in accordance with an aspect of the invention.

In FIG. 4B there is illustrated a further embodiment of method 400. Method 400 begins by setting the required components to give the desired beam current and then performing a first spectrum sweep and recording reactant peaks of interest 414. This is a baseline scan. Then, at least one co-gas is then introduced into the ion source chamber at 416 using a predefined ratio between the primary gas and co-gas flows. A second spectrum sweep is then performed at 418 and desired levels of reactant peaks are recorded. The co-gas flow rate is increased incrementally to a predetermined level saved by the user or programmed into the control system 201, and an AMU spectrum performed at each level of co-gas increase 422. A resulting desired dopant beam current is normalized at each level and the reactant peaks of interest will be reduced at each incremental increase of co-gas flow. When either the dopant beam current decreases or the reactant peaks of interest stop decreasing 424, optimal co-gas flow has been reached.

Figure 4C:
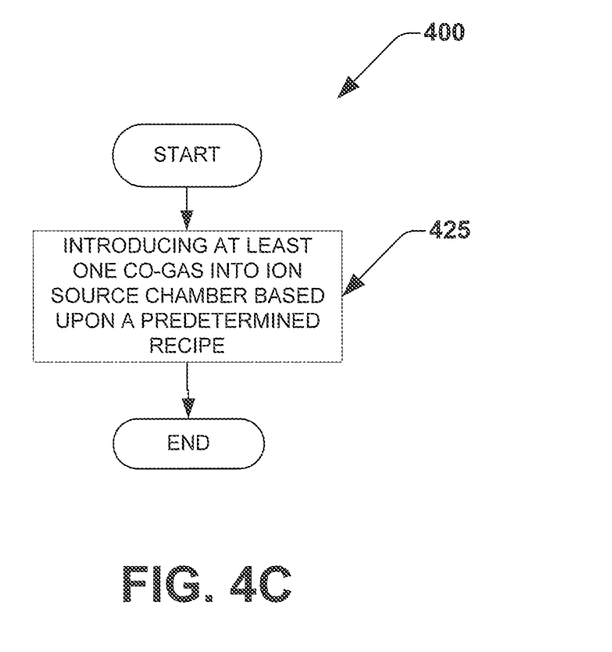
FIG. 4C is flow diagram illustrating a further embodiment of a method of controlling the flow rate of a co-gas in accordance with an aspect of the invention.

FIG. 4C illustrates a still further embodiment of method 400. In method 400, at least one co-gas is introduced into the ion source chamber at a flow rate based upon a predetermined table of recipes with dopant gas to co-gas flow ratios 425. In this manner, the selected flow rates of the at least one co-gas required to achieve maximum beam current and best productivity can be established.

Figure 4D:
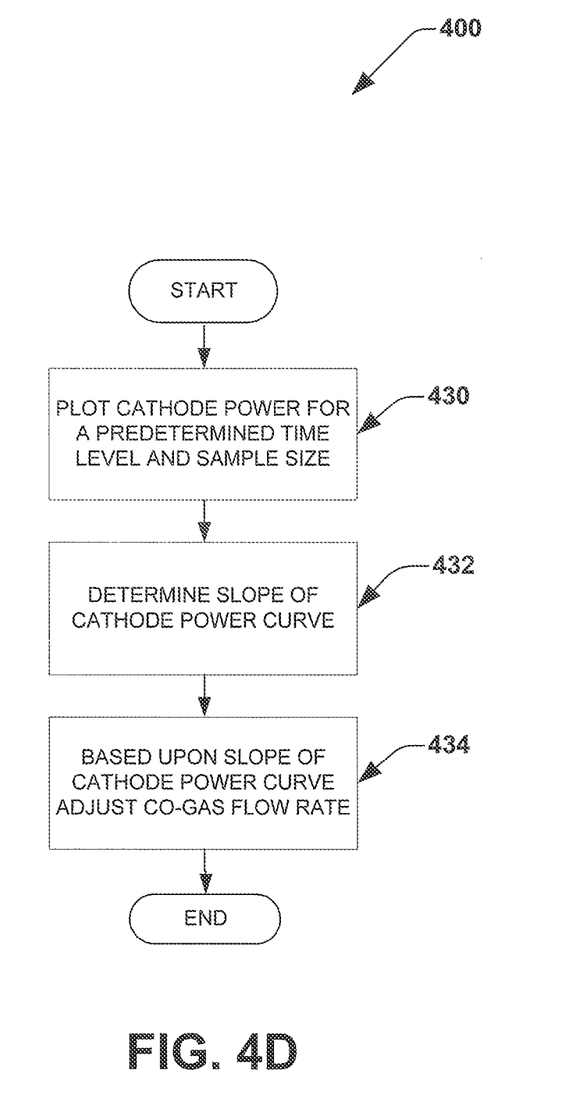
FIG. 4D is flow diagram illustrating a still further embodiment of a method of controlling the flow rate of a co-gas in accordance with an aspect of the invention.

In FIG. 4D, where the dopant gas source will comprise a fluoride-based gas, method 400 for control of co-gas flow rate can include of the methods out-lined previously to determine desired co-gas flow. The method continues at 430 where the cathode power is plotted for a predetermined time interval and sample size. At 432, the slope of the cathode power is determined. Based upon the slope of the cathode power, co-gas flow rate is then adjusted at 434.

While, for purposes of simplicity of explanation, the method 400 is depicted and described as executing serially, it is to be understood and appreciated that the invention is not limited by the illustrated order, as some aspects could, in accordance with the present, occur in different orders and/or concurrently with other aspects from that depicted and described herein. Moreover, not all illustrated features or blocks may be required to implement a methodology in accordance with an aspect the invention.

Figure 5:
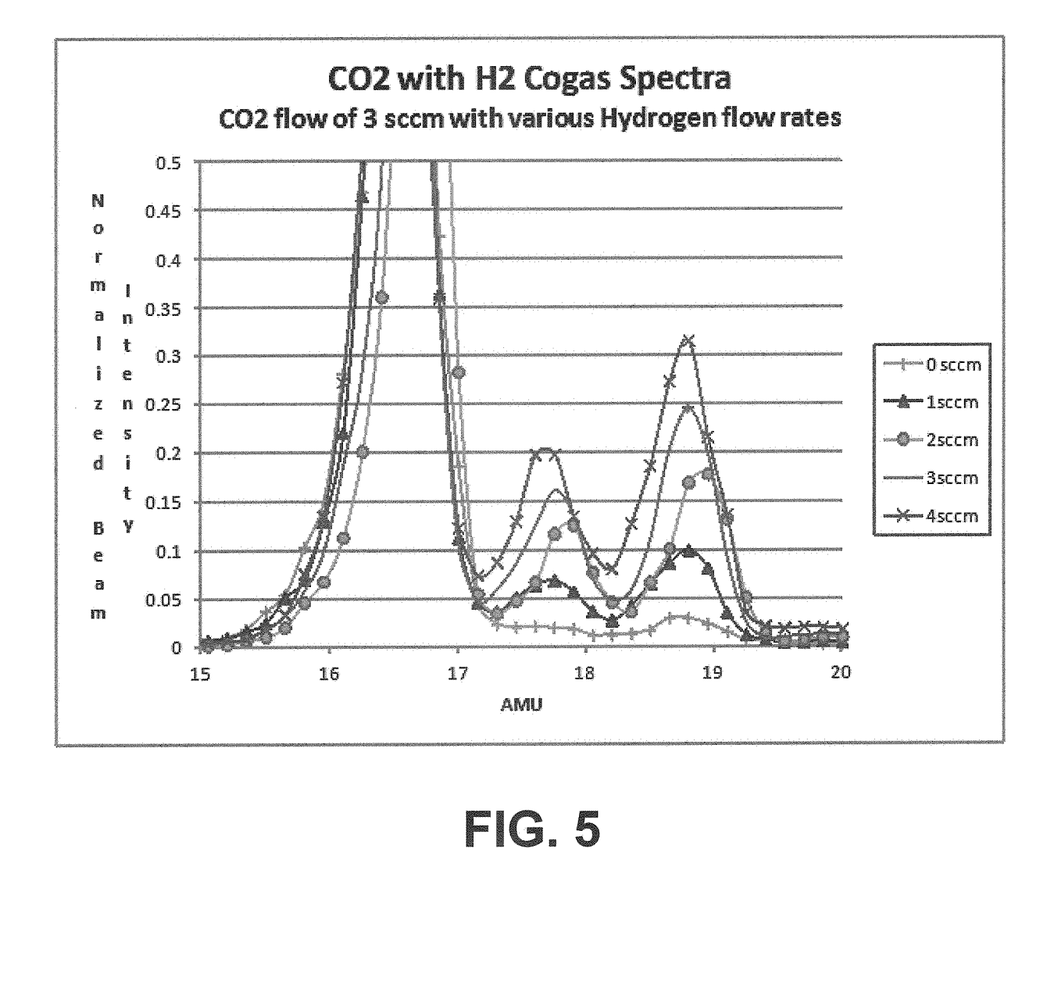
FIG. 5 is a graphical representation illustrating an optimization of a primary gas and a co-gas according to an embodiment of the invention.

FIG. 5 illustrates optimization of a carbon-containing primary gas with a hydrogen co-gas. As indicated from the chemical reaction:

The primary purpose is to introduce the co-gas so that the intensity of the by-products of the ionization are optimized. When observing the O-16, OH-17 and $H_2O$-18 intensities (peaks) the flow setting of 0 sccm $H_2$ is the baseline spectrum without the co-gas and OH-17 and $H_2O$-18 intensities are negligible. As more co-gas is introduced, the intensity of O-16 is reduced and at the same time, the OH-17 and $H_2O$-18 intensities are increased. However, the main carbon beam intensity at C-12 is not compromised, as indicated from legend 1 sccm, 2 sccm, 3 sccm and 4 sccm co-gas flows.

Figure 6:
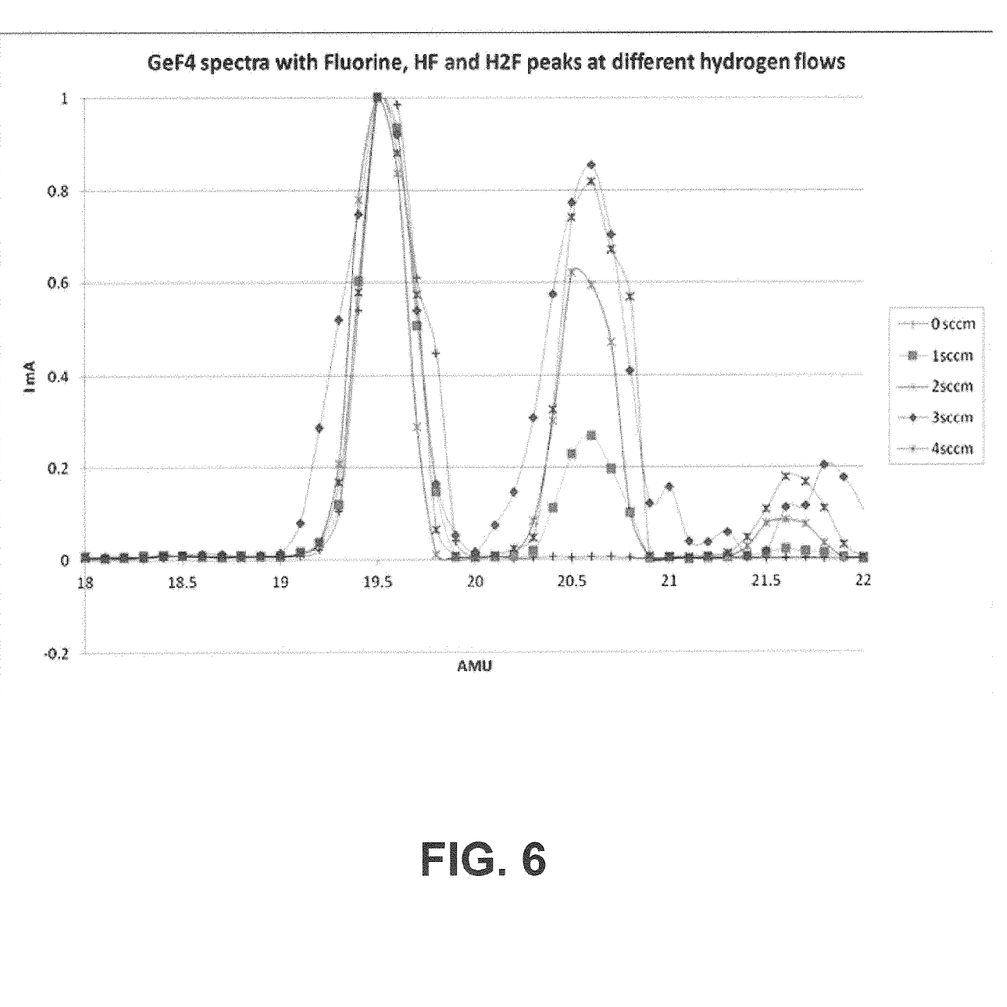
FIG. 6 is a graphical representation illustrating optimization of a primary gas and a co-gas according to a further embodiment of the invention.

FIG. 6 illustrates an additional example for optimizing co-gas flow rate using the AMU spectrum when running primary gas GeF4. The reducing gas (hydrogen) is introduced from 0 to 2.0 sccm (to the maximum flow without losing the beam current for this example). The fluorine peak at amu 19 is reduced in magnitude as the $H_2$ flow rate is increased. At the same time, the formation of HF at amu 20 should be also observed as it increases with the higher $H_2$ flow rate as shown below. At some flow the HF peak no longer increases and the F+ at amu 19 no longer decreases, thus defining the recipe set point.

Figure 7:
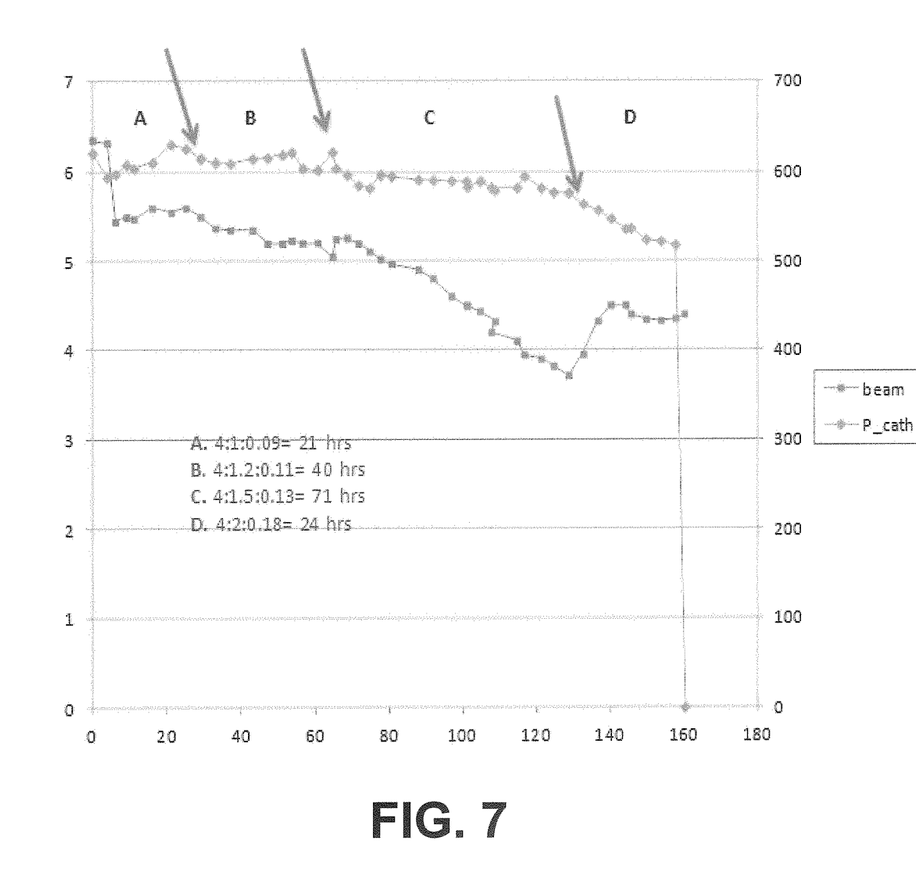
FIG. 7 is a graphical representation illustrating cathode power versus hydrogen co-gas flow.

FIG. 7 illustrates the effect of co-gas flow rate on the cathode power required to meet specified beam current. In this particular recipe the amount of the H2 co-gas flow determines how much $WF_6$ is formed and subsequently how much W is deposited onto the hot cathode when the $WF_6$ decomposes into its constituent component of W and F upon contact with the hot cathode surface (>800 C). This phenomenon is known as the "halogen cycle".

The chart is broken into sections A, B, C and D, each denoting a change is the co-gas flow. Section "A" is a flow of 4 sccm of a primary fluorine based gas with 1 sccm of a diluting co-gas gas with $H_2$ as its primary constituent. It is observed that the $H_2$ flow is inadequate to control the halogen cycle and the mass of the cathode is increasing over time resulting in an increase of cathode power. If this is not controlled the cathode mass will increase to a point where the power supply is at maximum (saturated) and electron emission can't be maintained. This causes the required beam current to drop below specified values.

Section "B" is a flow of 4 sccm of the primary fluorine based gas with 1.2 sccm of a diluting co-gas gas with $H_2$ as its primary constituent. It is observed that an increase of 0.2 sccm of total $H_2$ flow has leveled out the rise in cathode power when compared to 1 sccm of $H_2$ flow. Here the halogen cycle is still depositing material onto the cathode but at a rate equivalent to the sputter rate of the cathode material. This equilibrium could still be considered to be a problem as there material deposited via the halogen cycle onto other hot surfaces within the arc chamber. This will also have a deleterious effect on the source performance as the mass and or critical dimensions of the following components are changed. ie: arc slit width reduction, repeller mass increase, cathode repeller mass increase. A secondary effect is the deposition and subsequent flaking of loosely adhered tungsten deposits within the arc chamber and those pieces falling onto and across the biased cathode and repeller components to ground.

Section "C" is a flow of 4 sccm of the primary fluorine based gas with 1.5 sccm of a diluting co-gas with $H_2$ as its primary constituent. It is observed that at this flow rate that the halogen cycle has been further reduced but the cathode mass reduction due to sputtering is still at a minimum and that other internal arc chamber components are being deposited onto due to the halogen cycle.

Section "D" is a flow of 4 sccm of the primary fluorine based gas with 2 sccm of a diluting co-gas with $H_2$ as its primary constituent. It is observed that this flow rate that the halogen cycle is at a minimum and the cathode mass is being reduced due to sputtering over time. This is evidenced by the reduction in power over time required to heat the cathode for the required thermionic emission and resulting specified beam current. This could be considered an acceptable tuning solution.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

What is claimed is:

1. An ion implantation system for improving performance of an ion implanter comprising:
    a first gas source for providing a primary gas to an ion source chamber and a second gas source for providing a co-gas to the ion source chamber;
    at least one primary gas module for controlling primary gas and at least one co-gas module for controlling co-gas; and
    a control system for selecting the co-gas as a function of the selected primary gas.

2. The system of claim 1, the primary and co-gas modules comprising:
    a filter;
    a pressure reading device;
    a connection flange;
    at least one pneumatic valve; and
    a flow control device.

3. The system of claim 2, the primary and co-gas modules comprising a high pressure identifier or a sub-atmospheric identifier as defined by the pressure reading device.

4. The system of claim 1, wherein the co-gas module releases the co-gas from one or more co-gas sources into the ion source chamber.

5. The system of claim 1, wherein the operative control of the rate and flow of the co-gas into the ion source chamber is predetermined.

6. The system of claim 1, the primary and co-gas modules are specific to a particular co-gas.

7. The system of claim 5, wherein the operative control of the flow rate of the co-gas into the ion source chamber is automatically adjusted during operation of the ion implantation system.

8. An apparatus for improving performance of an ion implanter comprising:
    a primary gas module for introducing a primary gas into the ion source chamber, the primary gas comprising a fluorine-containing gas;
    a co-gas module for introducing at least one co-gas into the ion source chamber; and
    a control system for selecting the co-gas as a function of the selected primary gas.

9. The apparatus of claim 8, wherein the primary gas and co-gas modules comprise:
    a filter;
    a pressure reading device;
    a connection flange;
    at least one pneumatic valve; and
    a flow control device.

10. The apparatus of claim 8, wherein the primary gas source comprises one or more of boron trifluoride, germanium tetrafluoride, phosphorous trifluoride, silicon tetrafluoride, carbon dioxide, carbon monoxide, phosphine, arsine, or methane.

11. The apparatus of claim 8, wherein the co-gas source comprises hydrogen, fluorine, or an inert/noble gas.

12. The apparatus of claim 8, wherein the control system controls the primary and co-gas modules.

13. A method for improving performance of an ion implantation system comprising automatically selecting and controlling the flow rate of at least one co-gas into an ion source chamber.

14. The method of claim 13, the automatic control of flow rate at least one co-gas comprising:
    introducing a co-gas into an ion source chamber for generating a plasma therein;
    monitoring a beam current level in the ion source chamber; and
    adjusting the co-gas level based on the beam current level.

15. The method of claim 14, the monitoring comprising detection of a decrease in the beam current.

16. The method of claim 14, the adjusting comprising decreasing the co-gas level by a user-defined percentage as a function of the decrease in beam current.

17. The method of claim 13, further comprising verifying optimization of the co-gas rate and flow following a predetermined time.

18. The method of claim 13, the automatic control of the flow rate of at least one co-gas comprising:
    performing a first spectrum sweep and recording reactant peaks of interest;
    introducing at least one co-gas into an ion source chamber;
    performing a second spectrum sweep and recording one or more desired levels of reactant peaks of interest;
    increasing the at least one co-gas to a predetermined level; and
    verifying the desired beam current is maintained with minimum amplitudes of undesired AMU species of gas.

19. The method of claim 13, the automatic control of at least one co-gas comprising introducing at least one co-gas into an ion source chamber at a flow rate based upon a predetermined table of recipes with primary to co-gas flow ratios.

20. The method of claim 13 where the slope of the cathode power curve is monitored at some pre-determined time interval and the co-gas flow is adjusted to attain the desired power curve slope.

* * * * *